US008942052B2

(12) United States Patent
Huott et al.

(10) Patent No.: US 8,942,052 B2
(45) Date of Patent: Jan. 27, 2015

(54) COMPLEMENTARY METAL-OXIDE-SEMICONDUCTOR (CMOS) MIN/MAX VOLTAGE CIRCUIT FOR SWITCHING BETWEEN MULTIPLE VOLTAGES

(71) Applicant: International Business Machines Corporation, Armonk, NY (US)

(72) Inventors: William V. Huott, Holmes, NY (US); Michael Kugel, Boeblingen (DE); Juergen Pille, Stuttgart (DE); Rolf Sautter, Bondorf (DE); Dieter Wendel, Schoenaich (DE)

(73) Assignee: International Business Machines Corporation, Armonk, NY (US)

( * ) Notice: Subject to any disclaimer, the term of this patent is extended or adjusted under 35 U.S.C. 154(b) by 234 days.

(21) Appl. No.: 13/682,821

(22) Filed: Nov. 21, 2012

(65) Prior Publication Data

US 2014/0140157 A1 May 22, 2014

(51) Int. Cl.
*G11C 7/12* (2006.01)

(52) U.S. Cl.
CPC .................................... *G11C 7/12* (2013.01)
USPC ......................................... 365/203; 365/154

(58) Field of Classification Search
CPC ........................................................ G11C 7/12
USPC .................... 365/203, 226, 154, 146
See application file for complete search history.

(56) References Cited

U.S. PATENT DOCUMENTS

| | | | | |
|---|---|---|---|---|
| 5,966,319 A * | 10/1999 | Sato | ............................... | 365/154 |
| 7,502,275 B2 * | 3/2009 | Nii et al. | ...................... | 365/226 |
| 7,623,405 B2 | 11/2009 | Lysinger et al. | | |
| 7,639,066 B2 | 12/2009 | Harald | | |
| 7,924,650 B2 | 4/2011 | Cho et al. | | |
| 7,978,560 B2 | 7/2011 | Itoh et al. | | |
| 8,099,688 B2 | 1/2012 | Ellis et al. | | |
| 8,441,842 B2 * | 5/2013 | Rachamadugu et al. | ..... | 365/154 |
| 2004/0056716 A1 * | 3/2004 | Wey et al. | ..................... | 330/253 |
| 2004/0090818 A1 * | 5/2004 | Liaw | .............................. | 365/154 |
| 2009/0109764 A1 | 4/2009 | Houston | | |
| 2009/0207675 A1 * | 8/2009 | Kengeri et al. | .......... | 365/189.14 |
| 2012/0081176 A1 | 4/2012 | Buechner et al. | | |

OTHER PUBLICATIONS

Nakagome, Y. et al., "Review and future prospects of low-voltage RAM circuits", IBM Corporation, IBM Journal of Research and Development, vol. 47, Issue 5/6, Sep. 2003, pp. 525-552.
Prommee, Pipat et al., "CMOS WTA maximum and minimum circuits with their applications to analog switch and rectifiers", Microelectronics Journal archive, vol. 42, Issue 1, Jan. 2011, pp. 52-62.

* cited by examiner

*Primary Examiner* — Douglas King
(74) *Attorney, Agent, or Firm* — Francis Lammes; Stephen J. Walder, Jr.; Steven L. Bennett (57) ABSTRACT

A voltage selection mechanism is provided for switching between multiple voltages without causing a direct current (DC) that may further stress storage elements due to excessive power consumption and electro-migration effects. The voltage selection mechanism comprises cross-coupled circuitry, which comprises a first positive-channel field effect transistor (PFET) and a second PFET. The voltage selection mechanism further comprises diode circuitry, which comprises a third PFET and a fourth PFET.

24 Claims, 7 Drawing Sheets

COMPLEMENTARY METAL-OXIDE-SEMICONDUCTOR (CMOS) MIN/MAX VOLTAGE CIRCUIT FOR SWITCHING BETWEEN MULTIPLE VOLTAGES

BACKGROUND

The present application relates generally to an improved data processing apparatus and method and more specifically to a complementary metal-oxide-semiconductor (CMOS) min/max voltage circuit for switching between multiple voltages.

Storage elements in integrated circuits normally operate at a higher voltage than logic that surrounds the storage elements in order to improve stability of the storage elements. However, when testing is performed on such storage elements, a secondary voltage is utilized for stress testing and to guardband these storage elements by identifying one or more storage elements with marginal stability, thereby indicating a high likelihood of failure in the one or more storage elements.

SUMMARY

In one illustrative embodiment, a voltage selection circuit is provided for switching between multiple voltages without causing a direct current (DC) that may further stress storage elements due to excessive power consumption and electromigration effects. The voltage selection circuit of the illustrative embodiment comprises cross-coupled circuitry. The cross-coupled circuitry comprises a first positive-channel field effect transistor (PFET) and a second PFET. A source of the first PFET is coupled to a first voltage, a gate of the first PFET is coupled to a second voltage, and a drain of the first PFET is coupled to an input of a header circuitry, where the header device precharges a bit line of a memory cell. A source of the second PFET is coupled to the second voltage, a gate of the second PFET is coupled to the first voltage, and a drain of the second PFET is coupled to the input to the header circuitry. The voltage selection circuit of the illustrative embodiment further comprises diode circuitry. The diode circuitry comprises a third PFET and a fourth PFET. A source of the third PFET is coupled to the first voltage, a gate of the third PFET is coupled to the input to the header circuitry, and a drain of the third PFET is coupled to the input to the header circuitry. A source of the fourth PFET is coupled to the second voltage, a gate of the fourth PFET is coupled to the input to the header circuitry, and a drain of the fourth PFET is coupled to the input to the header circuitry.

In other illustrative embodiments, a memory is provided. The memory comprises a set of memory cells and a voltage selection circuit coupled to the set of memory cells. The voltage selection circuit comprising cross-coupled circuitry and diode circuitry as outlined above with regard to the voltage selection circuit illustrative embodiment.

In yet another illustrative embodiment, an apparatus is provided. The apparatus may comprise one or more processors and a memory coupled to the one or more processors. The memory comprises a set of memory cells and a voltage selection circuit coupled to the set of memory cells. The voltage selection circuit comprises cross-coupled circuitry and diode circuitry as outlined above with regard to the voltage selection circuit illustrative embodiment.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION

The illustrative embodiments provide a complementary metal-oxide-semiconductor (CMOS) min/max voltage circuit for switching between multiple voltages without causing a direct current (DC) that may further stress storage elements due excessive power consumption and electro-migration effects.

Figure 1:
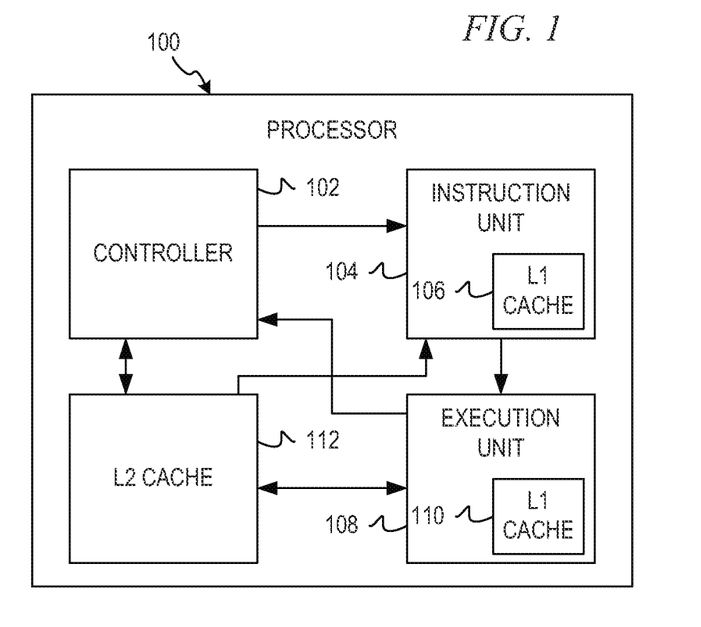
FIG. 1 is an exemplary block diagram of a processor in accordance with an illustrative embodiment.

FIG. 1 is provided as one example of a data processing environment in which a cache memory array may be utilized, i.e. in a cache of a processor. FIG. 1 is only offered as an example data processing environment in which the aspects of the illustrative embodiments may be implemented and is not intended to state or imply any limitation with regard to the types of, or configurations of, data processing environments in which the illustrative embodiments may be used. To the contrary, any environment in which a cache memory array may be utilized is intended to be within the spirit and scope of the present invention.

FIG. 1 is an exemplary block diagram of processor 100 in accordance with an illustrative embodiment. Processor 100 includes controller 102, which controls the flow of instructions and data into and out of processor 100. Controller 102 sends control signals to instruction unit 104, which includes L1 cache 106. Instruction unit 104 issues instructions to execution unit 108, which also includes L1 cache 110. Execution unit 108 executes the instructions and holds or forwards any resulting data results to, for example, L2 cache 112 or controller 102. In turn, execution unit 108 retrieves data from L2 cache 112 as appropriate. Instruction unit 104 also retrieves instructions from L2 cache 112 when necessary. Controller 102 sends control signals to control storage or retrieval of data from L2 cache 112. Processor 100 may contain additional components not shown, and is merely provided as a basic representation of a processor and does not limit the scope of the present invention. Although, FIG. 1 depicts only level 1 (L1) cache and Level 2 (L2) cache, the illustrative embodiments are not limited to only these levels of memory hierarchy. That is, the illustrative embodiments may be applied to any level of memory hierarchy without departing from the spirit and scope of the invention.

Those of ordinary skill in the art will appreciate that the hardware in FIG. 1 may vary depending on the implementation. Other internal hardware or peripheral devices, such as flash memory, equivalent non-volatile memory, or optical disk drives and the like, may be used in addition to or in place of the hardware depicted in FIG. 1. Also, the processes of the illustrative embodiments may be applied to a multiprocessor data processing system, without departing from the spirit and scope of the present invention.

Moreover, the data processing system 100 may take the form of any of a number of different data processing systems including client computing devices, server computing devices, a tablet computer, laptop computer, telephone or other communication device, a personal digital assistant (PDA), or the like. In some illustrative examples, data processing system 100 may be a portable computing device which is configured with flash memory to provide non-volatile memory for storing operating system files and/or user-generated data, for example. Essentially, data processing system 100 may be any known or later developed data processing system without architectural limitation.

Figure 2:
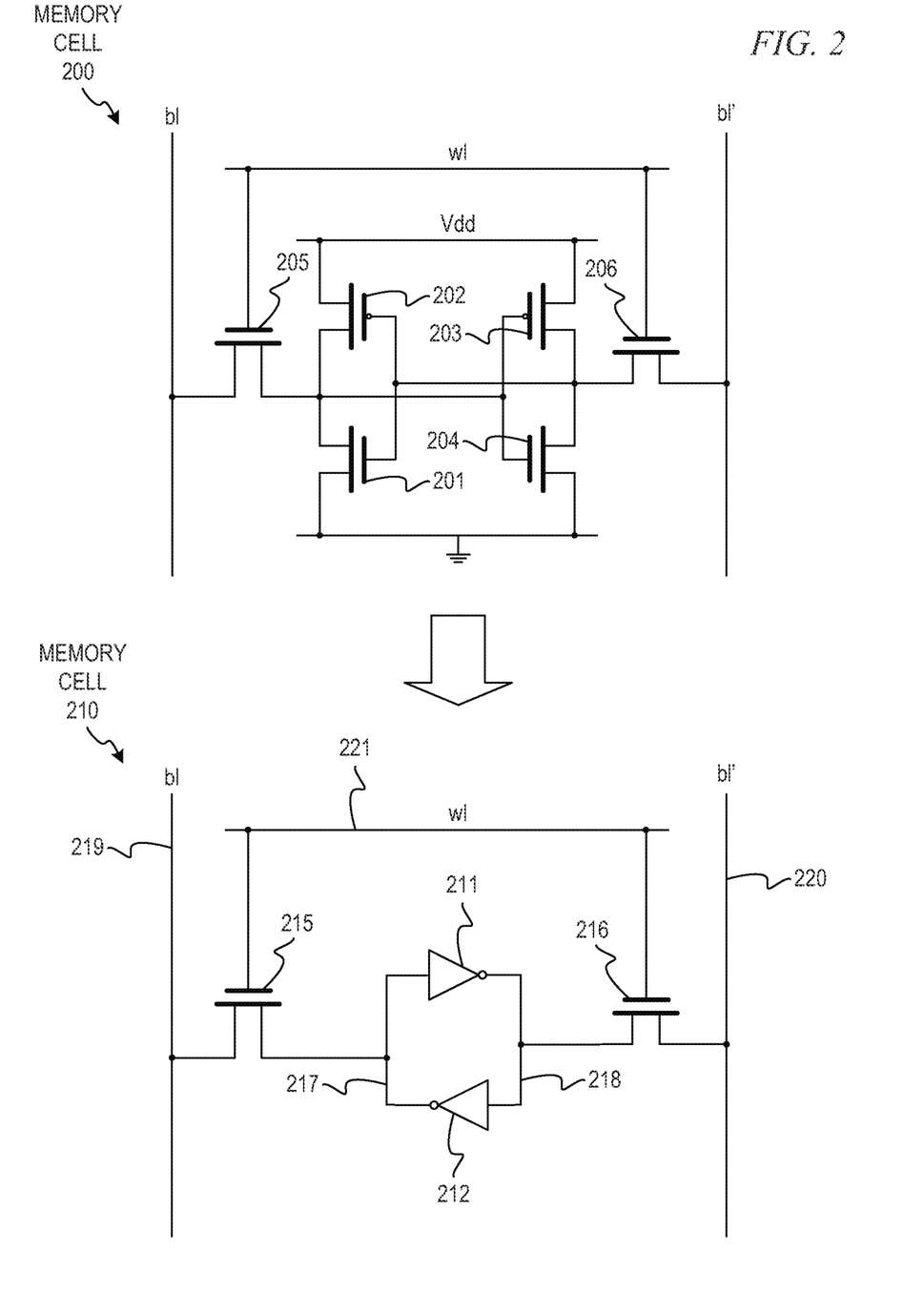
FIG. 2 depicts an example of a conventional 6 transistor (6T) memory cell in accordance with an illustrative embodiment.

FIG. 2 depicts an example of a conventional 6 transistor (6T) memory cell in accordance with an illustrative embodiment. Memory cell 200 forms the basis for most static random-access memories in complementary metal-oxide semiconductor (CMOS) technology. Memory cell 200 uses six transistors 201-206 to store and access one bit. Transistors 201-204 in the center form two cross-coupled inverters, which is illustrated in the more simplified memory cell 210 comprising inverters 211 and 212. Due to the feedback structure created by inverters 211 and 212, a low input value on inverter 211 will generate a high value on inverter 212, which amplifies (and stores) the low value on inverter 212. Similarly, a high input value on inverter 211 will generate a low input value on inverter 212, which feeds back the low input value onto inverter 211. Therefore, inverters 211 and 212 will store their current logical value, whatever value that is.

Lines 217 and 218 between inverters 211 and 212 are coupled to separate bit lines 219 and 220 via two n-channel pass-transistors 215 and 216. The gates of transistors 215 and 216 are driven by word line 221. In a memory array, word line 221 is used to address and enable all bits of one memory word. As long as word line 221 is kept low, memory cell 210 is decoupled from bit lines 219 and 220. Inverters 211 and 212 keep feeding themselves and memory cell 210 stores its current value.

When word line 221 is high, both transistors 215 and 216 are conducting and connect the inputs and outputs of inverters 211 and 212 to bit lines 219 and 220. That is, inverters 211 and 212 drive the current data value stored inside the memory cell 210 onto bit-line 219 and the inverted data value onto inverted bit-line 220. To write new data into memory cell 210, word line 221 is activated and, depending on the current value stored inside memory cell 210, there might be a short-circuit condition and the value inside memory cell 210 is literally overwritten. This only works because transistors 201-204 that make up inverters 211 and 212 are very weak. That is, transistors 202-203 are considered weak because when new data is to be written to transistors 201-204, the current state of transistors 201-204 may be easily overridden with the new state.

The majority of the power dissipated in cache memory arrays comes from the pre-charging and discharging of bit lines during a read access because the bit lines span the entire height of the cache memory array, and tend to be highly capacitive. The implementation shown has two bit line hierarchies, called local and global, but there are also schemes with a single hierarchy or even more than two. The bit lines, such as bit lines 219 and 220 in FIG. 2, are local bit lines directly coupled to a bit line evaluation circuit. Each of the bit line evaluation circuits are coupled to a global bit line that couples to a global bit line latch, which is illustrated in FIG. 3.

Figure 3:
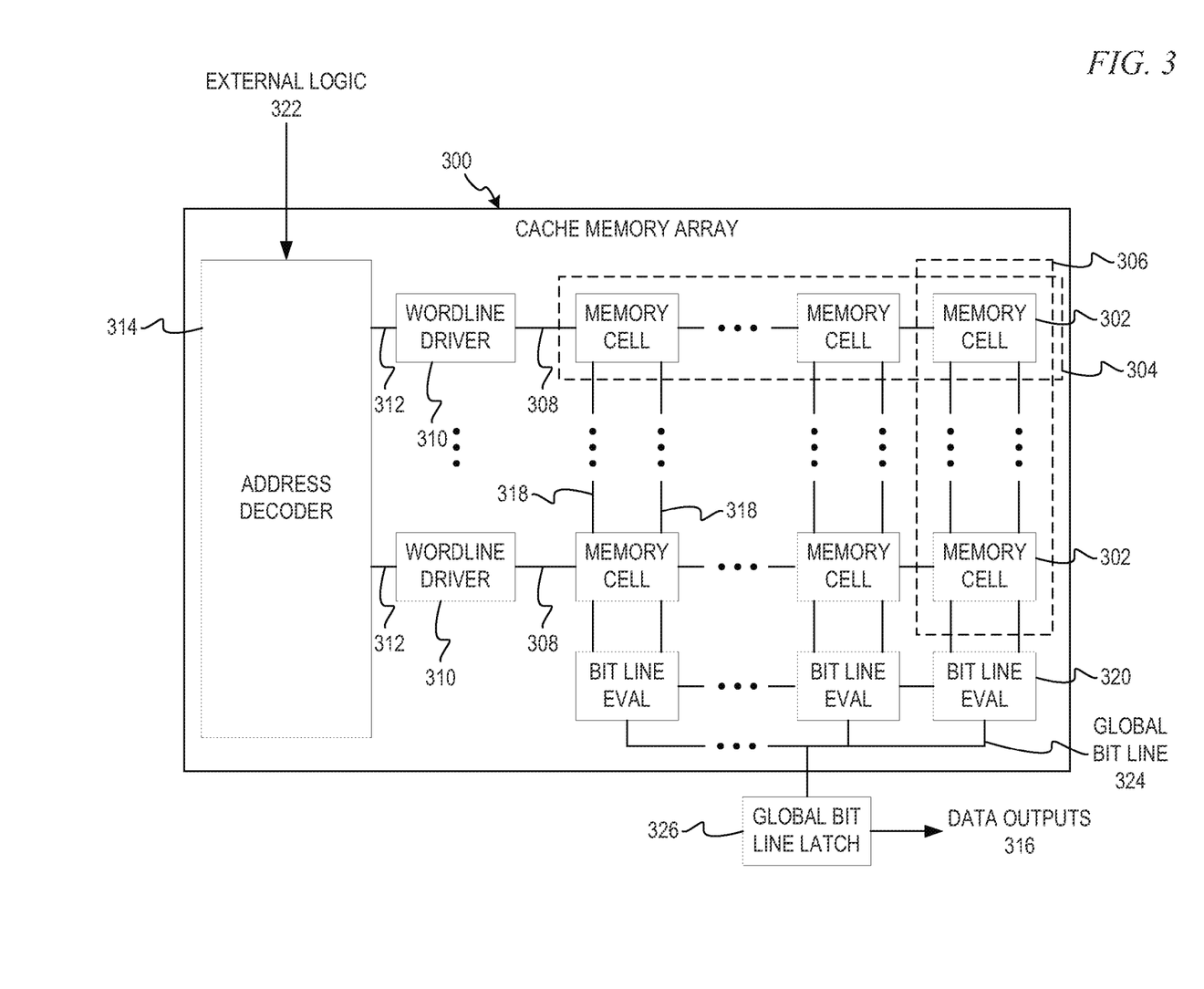
FIG. 3 illustrates a high-level example of a typical cache memory array comprising multiple memory cells in accordance with an illustrative embodiment.

FIG. 3 illustrates a high-level example of a typical cache memory array 300 comprising multiple memory cells 302 in accordance with an illustrative embodiment. Memory cells 302 are arranged as an array having rows 304 and columns 306. Memory cells 302 in a particular row 304 are connected to one another by word lines 308. Word lines 308 of each row 304 are also connected to word line drivers 310 which receive output 312 from address decoder 314 that identifies which row 304 is to be output and cache memory array 300 outputs the corresponding data entry through data outputs 316. Word line driver 310 may provide a single word line, such as word line 221 of FIG. 2, or a write word line and a read word line. Memory cells 302 in a particular column 306 are connected to one another by a pair of bit lines 318 which are driven to complimentary during read/write executions and are traditionally precharged to the voltage supply. Bit lines 318 may be true and compliment bit lines, such as true bit line 219 and compliment 220 of FIG. 2 and feed bit line evaluation logic 320 to convert the signal from local bit line 318 to a global bit line signal. That is, bit line evaluation logic 320 amplifies the single-ended signal from local bit lines 318 and outputs a single-ended global bit line signal 324, which is then latched by global bit line latch 326 for use in logic downstream.

In operation, address decoder 314 receives an address associated with a read/write access from external logic 322. Address decoder 314 decodes the address and signals the particular one of word line drivers 310 associated with the decoded address using output 312. The particular one of word line drivers 310 then fires due to the signal from address decoder 314 and the data in the associated row 304 of memory cells 302 is output through bit line evaluation logic 320 to global bit line 324, which is then latched by global bit line latch 326. Global bit line latch 326 feeds data outputs 316 if the access is a read access.

Figure 4:
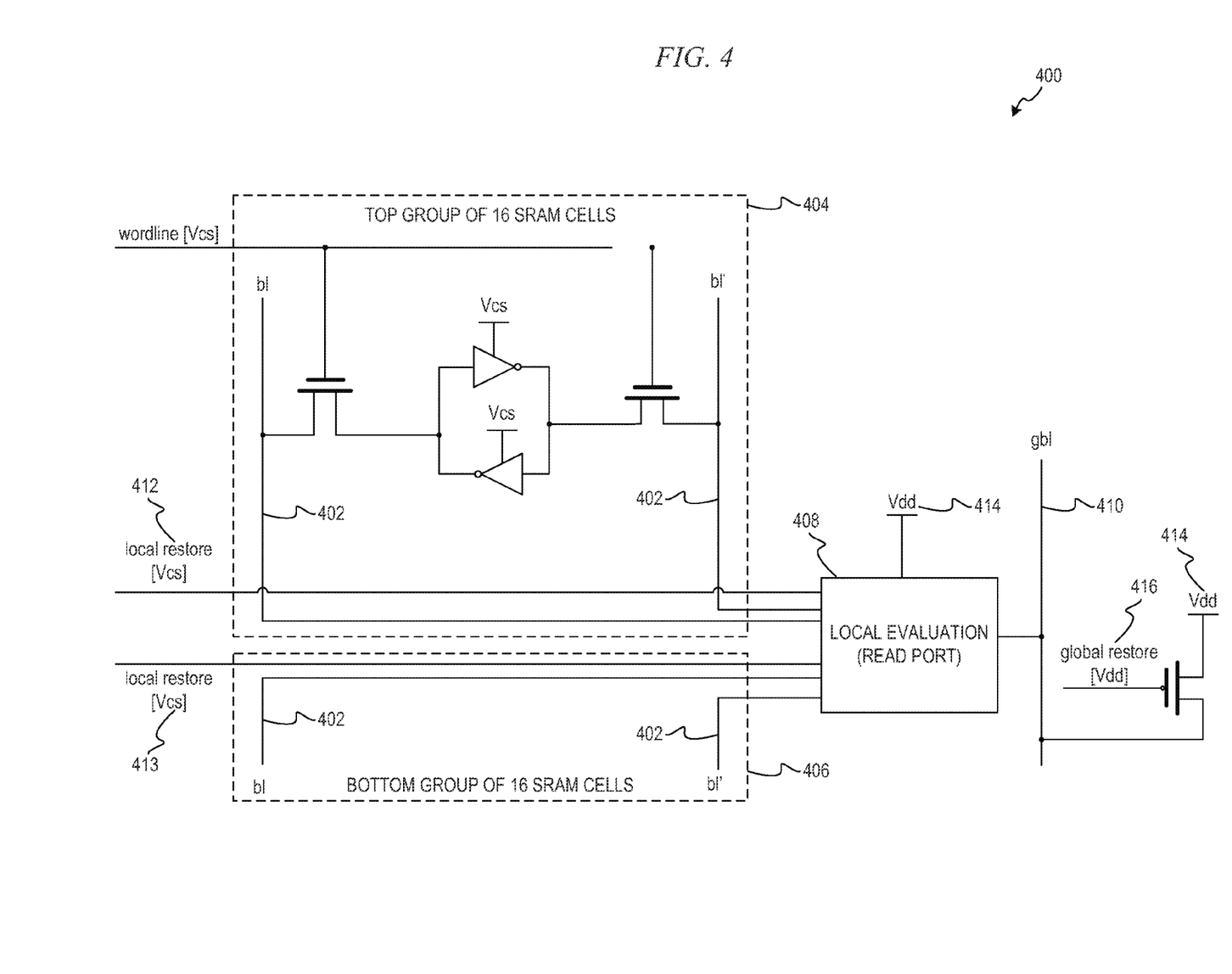
FIG. 4 depicts a cache memory array in which multiple voltages are utilized to control various signals and precharge device(s) in accordance with an illustrative embodiment.

During normal operation, after every read operation, a precharge device resets the state of read bit lines 318 and global bit line 324 to a voltage such as voltage Vdd. FIG. 4 depicts a cache memory array in which multiple voltages are utilized to control various signals and precharge device(s) in accordance with an illustrative embodiment. As is shown in memory array 400, bit lines 402 of groups of memory cells 404 and 406 feed local evaluation port 408, which may be a bit line evaluator such as bit line evaluation logic 320 of FIG. 3, to convert the single ended local bit line signal to a single-ended global bit line signal for use in downstream logic. That is, upon a read of one of the memory cells in groups of memory cells 404 and 406, local evaluation port 408 provides a single ended signal onto global bit line 410. Each of groups of memory cells 404 and 406 has its own respective local restore signal, local restore signals 412 and 413, respectively. Thus, after the read from group of memory cells 404, local restore signal 412, which is a Vcs voltage signal, initiates a precharge of bit lines 402 in memory cells 404 to voltage Vdd 414, and, after the read from group of memory cells 406, local restore signal 413, which is also a Vcs voltage signal, initiates a precharge of bit lines 402 in memory cells 406 to voltage Vdd 414. Likewise, after each read, global restore signal 416, which is a Vdd voltage signal, initiates a precharge of global bit line 410 to voltage Vdd 414.

Figure 5:
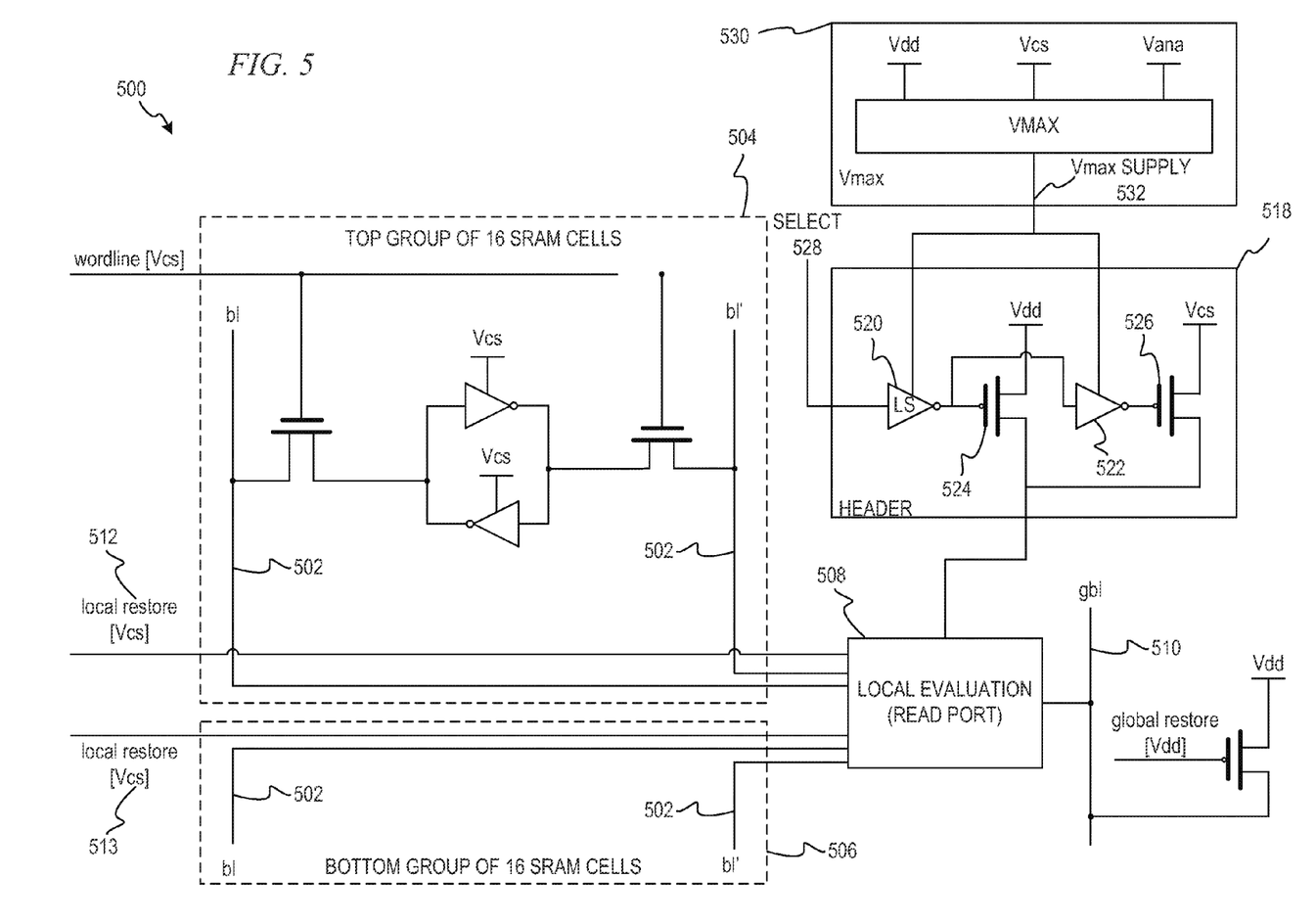
FIG. 5 depicts a header device with a voltage maximum (Vmax) circuit that applies a maximum select signal in accordance with an illustrative embodiment.

FIG. 5 depicts a cache memory array which utilizes a header device with voltage maximum (Vmax) circuit that applies a maximum of two voltages in accordance with an illustrative embodiment. Memory array 500 mirrors memory array 400 of FIG. 4 in that bit lines 502 of groups of memory cells 504 and 506 feed local evaluation port 508, which may be a bit line evaluator such as bit line evaluation logic 320 of FIG. 3. Further, upon a read of one of the memory cells in, for example, group of memory cells 504, local evaluation port 508 provides a single ended signal onto global bit line 510. After the read, local restore signal 512, which is a Vcs voltage signal, initiates a precharge of bit lines 502 in memory cells 504. Likewise, upon a read of one of the memory cells in, for example, group of memory cells 506, local evaluation port 508 provides a single ended signal onto global bit line 510. After the read, local restore signal 513, which is a Vcs voltage signal, initiates a precharge of bit lines 502 in memory cells 506. However, unlike memory array 400 of FIG. 4, in accordance with the illustrative embodiments, when testing of storage elements, such as memory cells 504 and 506, multiple voltages may be provided for different operation and/or test modes. Thus, bit lines 502 may be precharged to Vdd or Vcs.

In order to precharge bit lines 502, the illustrative embodiments provide header device 518. Header device 518 comprises voltage level shifter 520 and inverter 522. Voltage level shifter 520 and inverter 522 control positive-channel field effect transistors (PFETs) 524 and 526 activate to allow their associated voltage Vdd or Vcs, respectively, to charge bit lines 502, via connection to local evaluation port 508. Voltage level shifter 520 is utilized to overcome a condition when Vmax supply 532 is higher than the voltage level of select signal 528. Select signal 528 is an external input to header 518 utilized for the selection of PFET 524 or PFET 526. Effectively, with select signal 528, a decision is made as to run in either a test mode or a functional mode. In the functional mode, PFET 526 connects Vcs to local evaluation circuit 508. In the functional mode, storage elements in integrated circuits are usually operated at a higher voltage (Vcs) than the surrounding logic to improve stability of the storage elements. In the test mode, PFET 524 connects Vdd to local evaluation circuit 508. The test mode is used to stress and guardband the memory cells in groups of memory cells 504 and 506 by identifying those memory cells with marginal stability which could fail during lifetime.

Voltage maximum (Vmax) circuit 530 selects the maximum voltage between the multiple voltages (max[Vdd, Vcs]) and applies Vmax supply 532 to voltage level shifter 520 and inverter 522. A PFET is only fully turned OFF and currentless if the gate of the PFET is driven by the same or a higher voltage as the source of the PFET. Since there is no fix relationship between the two voltages and either one could be higher than the other, an extra circuit is required to select the maximum voltage between the two (max[Vdd, Vcs]). However, Vmax circuit 530 requires yet a third voltage, which is an analog voltage (Vana), that is used to supply Vmax circuit 530 itself independent of the multiple voltages, Vdd and Vcs, that are being compared. The Vana voltage is required to always be higher than the other voltages and be stable before voltages Vdd and Vcs are ever applied to the Vmax circuit 530. Thus, Vmax circuit 530 is of analog nature, are slow, and are sensitive to PVT (device parameter, voltage, temperature variation), resulting in control difficulties. That is, additional voltages and complex power on sequences increase the complexity of the system and increase cost.

Figure 6:
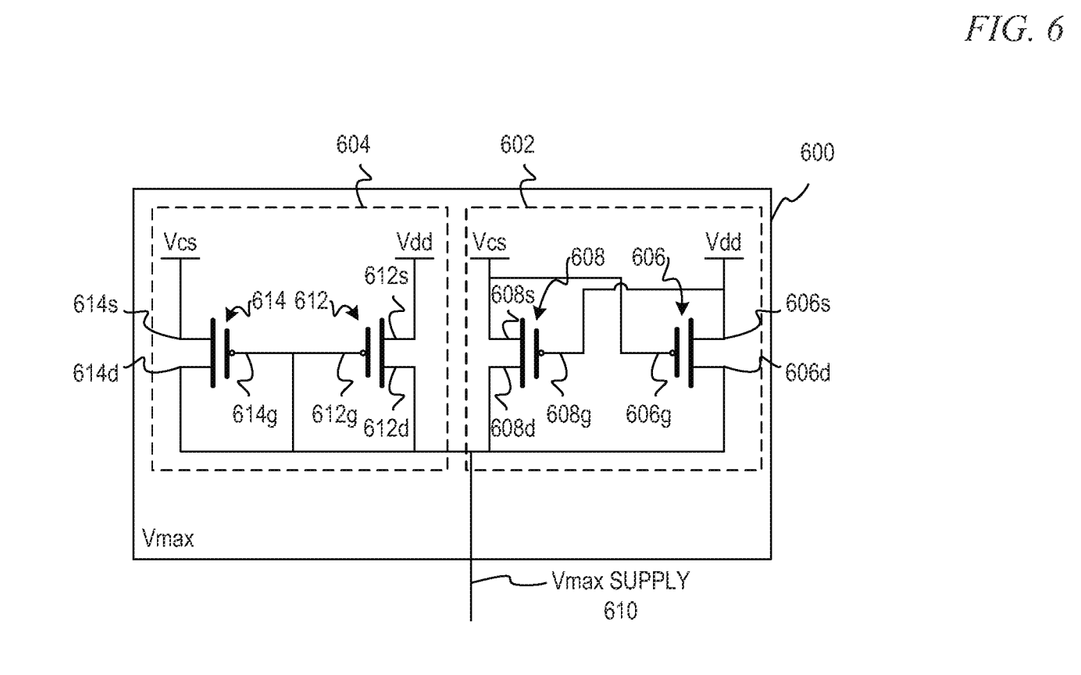
FIG. 6 depict an improved voltage maximum (Vmax) circuit in accordance with an illustrative embodiment.

In order to provide a voltage maximum (Vmax) circuit that does not require an extra voltage, or any other control logic, and guarantees that no DC current flows thru the header devices that may further stress storage elements due to excessive power consumption and electro-migration effects, the illustrative embodiments depict in FIG. 6 an improved voltage maximum (Vmax) circuit 600 in accordance with an illustrative embodiment, Vmax circuit 600 comprises cross-coupled PFET circuitry 602 and PFET diode circuitry 604.

Cross-coupled PFET circuitry 602 comprises PFET 606 and PFET 608, where PFET 606 has source 606s coupled to voltage Vdd, gate 606g coupled to voltage Vcs, and drain 606d coupled to Vmax supply 610, and where PFET 608 has source 608s coupled to voltage Vcs, gate 608g coupled to voltage Vdd, and drain 608d coupled to Vmax supply 610. During a power on sequence, one voltage is raised first before the second voltage, for example, voltage Vdd is raised before voltage Vcs is raised. As long as Vcs is low, PFET 606, which is active due to the presence of the inactive signal from voltage Vcs at gate 606g, is fully on so that Vmax supply 610 follows voltage Vdd. Further, PFET 608 is inactive due to the presence of the active signal from voltage Vdd at gate 608g. Similarly, if voltage Vcs is raised before voltage Vdd is raised. As long as Vdd is low, PFET 608, which is active due to the presences of the inactive signal from voltage Vdd at gate 608g, is fully on so that Vmax supply 610 follows voltage Vcs. Further, PFET 606 is inactive due to the presence of the active signal from voltage Vcs at gate 606g.

Thus, cross-coupled PFET circuitry 602 works property as long as the absolute difference between voltages Vdd and Vcs is greater than a threshold voltage Vt (|Vdd−Vcs|>Vt) apart. That is, Vmax supply 610 always reaches the full voltage level of the maximum voltage, guaranteeing that the maximum of Vdd or Vcs is applied to the level shifter and inverter of the header, such as is shown in FIG. 5.

However, when the absolute difference between voltages Vdd and Vcs are less than or equal to the threshold voltage Vt (|Vdd−Vcs|≤Vt), both PFET 606 and 608 will be inactive and Vmax supply 610 floats. That is, when voltages Vdd and Vcs are greater than 0 but are less than or equal to the threshold voltage Vt apart, then the presence of the voltages Vdd and Vcs at gates 608g and 606g, respectively, cause both PFET 606 and PFET 608 to be fully inactive. Since both PFET 606 and PFET 608 are inactive, there is no active device to hold Vmax supply 610 to either voltage Vdd or voltage Vcs. Therefore, Vmax supply 610 may drift away due to leakage or noise.

In order to account for events where PFET 606 and PFET 608 are both inactive, the illustrative embodiments provide PFET diode circuitry 604. PFET diode circuitry 604 comprises PFETs 612 and 614, where PFET 612 has source 612s coupled to voltage Vdd, and both gate 612g and drain 612d coupled to Vmax supply 610, and where PFET 614 has source 614s coupled to voltage Vcs, and both gate 614g and drain 614d coupled to Vmax supply 610.

Again, a PFET device is only active as long as the gate voltage is greater than the threshold voltage Vt below the source voltage. For PFET 612, source 612s will be equal to voltage Vdd and gate 612g and drain 612d will be equal to Vmax supply 610. For PFET 614, source 614s will be equal to voltage Vcs and gate 614g and drain 614d will be equal to Vmax supply 610. With both devices in parallel, the result is Vmax supply 610 being equal to the max[Vdd, Vcs]−Vt and Vmax supply 610 will always result into a voltage level that is approximately the threshold voltage Vt below max[Vdd, Vcs]. Because PFET 612 and PFET 614 are configured as a diode with gates 612g and 614g being coupled together with drains 612d and 614d, when Vmax>Vdd and Vmax<Vcs, then PFET 612 is OFF because the gate source voltage is less than 0 and PFET 614 is ON. Conversely, when Vmax<Vdd and Vmax>Vcs, then PFET 614 is OFF and PFET 612 is ON. When Vmax=Vcs=Vdd, then both PFET 612 and PFET 614 are OFF, but the load on Vmax driven now by leakage will drive down Vmax to (Vdd−Vt).

As long as the voltages Vdd and Vcs are within the threshold voltage apart this will result in a negligible sub-threshold leakage. If noise or leakage pulls down the Vmax voltage level, PFET diode circuitry 604 will open and actively recover the drop. If one voltage becomes the threshold voltage Vt or more higher than the other again, the PFET whose gate is connected to the lower voltage will become active again and Vmax supply 610 will follow the higher voltage. Thus, cross-coupled PFET circuitry 602 activates, which then inactivates PFET diode circuitry 604.

Accordingly, each of cross-coupled PFET circuitry 602 and PFET diode circuitry 604 has a different operating range. Cross-coupled PFET circuitry 602 operating when both voltages Vdd and Vcs are greater than the threshold voltage Vt apart. PFET diode circuitry 604 operates when Vmax is a Vt below either Vdd or Vcs. The combination of both cross-coupled PFET circuitry 602 and PFET diode circuitry 604 guarantees full functionality across the complete voltage range, including power-on sequences and without any additional control circuitries or extra voltage supplies.

The circuit as described above may be part of the design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design may then be converted into the appropriate format (e.g., GDSII) for the fabrication of photolithographic masks, which typically include multiple copies of the chip design in question that are to be formed on a wafer. The photolithographic masks may be utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip may be mounted in a single chip package (such as a plastic carrier, with leads that are affixed to a motherboard or other higher level carrier) or in a multichip package (such as a ceramic carrier that has either or both surface interconnections or buried interconnections). In any case, the chip may then be integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor. Moreover, the end products in which the integrated circuit chips may be provided may include game machines, game consoles, hand-held computing devices, personal digital assistants, communication devices, such as wireless telephones and the like, laptop computing devices, desktop computing devices, server computing devices, or any other computing device.

Figure 7:
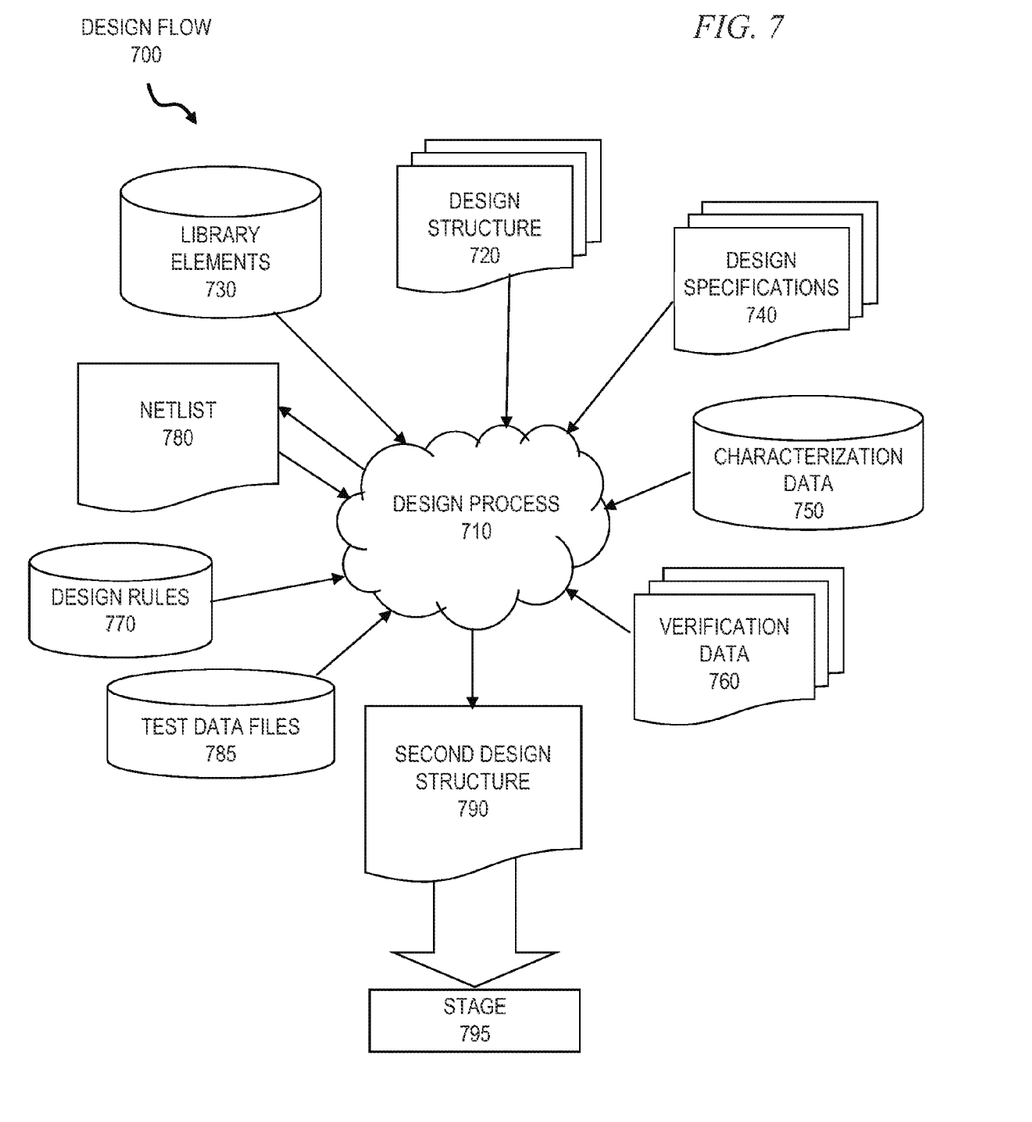
FIG. 7 shows a block diagram of an exemplary design flow used, for example, in semiconductor IC logic design, simulation, test, layout, and manufacture.

FIG. 7 shows a block diagram of an exemplary design flow 700 used, for example, in semiconductor IC logic design, simulation, test, layout, and manufacture. Design flow 700 includes processes and mechanisms for processing design structures to generate logically or otherwise functionally equivalent representations of the embodiments of the invention shown in FIGS. 2-6. The design structures processed and/or generated by design flow 700 may be encoded on machine-readable transmission or storage media to include data and/or instructions that when executed or otherwise processed on a data processing system generate a logically, structurally, or otherwise functionally equivalent representation of hardware components, circuits, devices, or systems.

FIG. 7 illustrates multiple such design structures including an input design structure 720 that is preferably processed by a design process 710. Design structure 720 may be a logical simulation design structure generated and processed by design process 710 to produce a logically equivalent functional representation of a hardware device. Design structure 720 may also or alternatively comprise data and/or program instructions that when processed by design process 710, generate a functional representation of the physical structure of a hardware device. Whether representing functional and/or structural design features, design structure 720 may be generated using electronic computer-aided design (ECAD) such as implemented by a core developer/designer. When encoded on a machine-readable data transmission or storage medium, design structure 720 may be accessed and processed by one or more hardware and/or software modules within design process 710 to simulate or otherwise functionally represent an electronic component, circuit, electronic or logic module, apparatus, device, or system such as those shown in FIGS. 2-6. As such, design structure 720 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 710 preferably employs and incorporates hardware and/or software modules for synthesizing, translating, or otherwise processing a design/simulation functional equivalent of the components, circuits, devices, or logic structures shown in FIGS. 2-6 to generate a netlist 780 which may contain design structures such as design structure 720. Netlist 780 may comprise, for example, compiled or otherwise processed data structures representing a list of wires, discrete components, logic gates, control circuits, I/O devices, models, etc. that describes the connections to other elements and circuits in an integrated circuit design. Netlist 780 may be synthesized using an iterative process in which netlist 780 is resynthesized one or more times depending on design specifications and parameters for the device. As with other design structure types described herein, netlist 780 may be recorded on a machine-readable data storage medium. The medium may be a non-volatile storage medium such as a magnetic or optical disk drive, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 710 may include hardware and software modules for processing a variety of input data structure types including netlist 780. Such data structure types may reside, for example, within library elements 730 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 740, characterization data 750, verification data 760, design rules 770, and test data files 785 which may include input test patterns, output test results, and other testing information. Design process 710 may further include modules for performing standard circuit design processes such as timing analysis, verification, design rule checking, place and route operations, etc.

Design process 710 employs and incorporates well-known logic and physical design tools such as HDL compilers and simulation model build tools to process design structure 720 together with some or all of the depicted supporting data structures to generate a second design structure 790. Similar to design structure 720, design structure 790 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 2-6. In one embodiment, design structure 790 may comprise a compiled, executable HDL simulation model that functionally simulates the devices shown in FIGS. 2-6.

Design structure 790 may also employ a data format used for the exchange of layout data of integrated circuits and/or symbolic data format (e.g. information stored in a GDSII (GDS2), GL1, OASIS, map files, or any other suitable format for storing such design data structures). Design structure 790 may comprise information such as, for example, symbolic data, map files, test data files, design content files, manufacturing data, layout parameters, wires, levels of metal, vias, shapes, data for routing through the manufacturing line, and any other data processed by semiconductor manufacturing tools to fabricate embodiments of the invention as shown in FIGS. 2-6. Design structure 790 may then proceed to a stage 795 where, for example, design structure 790 proceeds to tape-out, is released to manufacturing, is released to a mask house, is sent to another design house, is sent back to the customer, etc.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A voltage selection circuit, comprising:
cross-coupled circuitry, wherein the cross-coupled circuitry comprises a first positive-channel field effect transistor (PFET) and a second PFET, wherein:
a source of the first PFET is coupled to a first voltage,
a gate of the first PFET is coupled to a second voltage,
a drain of the first PFET is coupled to an input of a header circuitry,
wherein the header device precharges a bit line of a memory cell,
a source of the second PFET is coupled to the second voltage,
a gate of the second PFET is coupled to the first voltage, and
a drain of the second PFET is coupled to the input to the header circuitry; and
diode circuitry, wherein the diode circuitry comprises a third PFET and a fourth PFET, wherein:
a source of the third PFET is coupled to the first voltage,
a gate of the third PFET is coupled to the input to the header circuitry,
a drain of the third PFET is coupled to the input to the header circuitry,
a source of the fourth PFET is coupled to the second voltage,
a gate of the fourth PFET is coupled to the input to the header circuitry, and
a drain of the fourth PFET is coupled to the input to the header circuitry.

2. The voltage selection circuit of claim 1, wherein, responsive to the first voltage being greater than the second voltage by a voltage threshold, the first voltage is applied to the header circuitry in order to precharge the bit line of the memory cell.

3. The voltage selection circuit of claim 2, wherein, responsive to the first voltage being greater than the second voltage by the voltage threshold, the first voltage deactivates the second NTT thereby preventing the second voltage from passing to the header circuitry.

4. The voltage selection circuit of claim 1, wherein, responsive to the second voltage being greater than the first voltage by a voltage threshold, the second voltage is applied to the header circuitry in order to precharge the bit line of the memory cell.

5. The voltage selection circuit of claim 4, wherein, responsive to the second voltage being greater than the first voltage by the voltage threshold, the second voltage deactivates the first PFET thereby preventing the first voltage from passing to the header circuitry.

6. The voltage selection circuit of claim 1, wherein, responsive to the first voltage being greater than the second voltage by less than a voltage threshold, the first voltage is applied to the header circuitry in order to precharge the bit line of the memory cell.

7. The voltage selection circuit of claim 6, wherein, responsive to the first voltage being greater than the second voltage by less than the voltage threshold, the first voltage is passed through the third PFET to the header circuitry.

8. The voltage selection circuit of claim 1, wherein, responsive to the second voltage being greater than the first voltage by less than a voltage threshold, the second voltage is applied to the header circuitry in order to precharge the bit line of the memory cell.

9. The voltage selection circuit of claim 8, wherein, responsive to the second voltage being greater than the first voltage by less than the voltage threshold, the second voltage is passed through the fourth PFET to the header circuitry.

10. The voltage selection circuit of claim 1, wherein, responsive to an absolute difference of the first voltage and the second voltage being less than a voltage threshold, both the third PFET and the fourth PFET behave like a diode in analog mode thereby allowing a maximum of the first voltage or the second voltage to be driven down to Vmax minus the voltage threshold.

11. A memory comprising:
a set of memory cells;
a voltage selection circuit coupled to the set of memory cells, wherein the voltage selection circuit comprises:
cross-coupled circuitry, wherein the cross-coupled circuitry comprises a first positive-channel field effect transistor (PFET) and a second PFET, wherein:
a source of the first PFET is coupled to a first voltage,
a gate of the first PFET is coupled to a second voltage,
a drain of the first PFET is coupled to an input of a header circuitry,
wherein the header device precharges a bit line of the set of memory cells,
a source of the second PFET is coupled to the second voltage,
a gate of the second PFET is coupled to the first voltage, and
a drain of the second PFET is coupled to the input to the header circuitry; and
diode circuitry, wherein the diode circuitry comprises a third PFET and a fourth PFET, wherein:
a source of the third PFET is coupled to the first voltage,
a gate of the third PFET is coupled to the input to the header circuitry,
a drain of the third PFET is coupled to the input to the header circuitry,
a source of the fourth PFET is coupled to the second voltage,
a gate of the fourth PFET is coupled to the input to the header circuitry, and
a drain of the fourth PFET is coupled to the input to the header circuitry.

12. The memory of claim 11, wherein, responsive to the first voltage being greater than the second voltage by a voltage threshold, the first voltage is applied to the header circuitry in order to precharge the bit line of the memory cell.

13. The memory of claim 12, wherein, responsive to the first voltage being greater than the second voltage by the voltage threshold, the first voltage deactivates the second PFET thereby preventing the second voltage from passing to the header circuitry.

14. The memory of claim 11, wherein, responsive to the second voltage being greater than the first voltage by a voltage threshold, the second voltage is applied to the header circuitry in order to precharge the bit line of the memory cell.

15. The memory of claim 14, wherein, responsive to the second voltage being greater than the first voltage by the voltage threshold, the second voltage deactivates the first PFET thereby preventing the first voltage from passing to the header circuitry.

16. The memory of claim 11, wherein, responsive to the first voltage being greater than the second voltage by less than a voltage threshold, the first voltage is applied to the header circuitry in order to precharge the bit line of the memory cell and wherein, responsive to the first voltage being greater than the second voltage by less than the voltage threshold, the first voltage is passed through the third PFET to the header circuitry.

17. The memory of claim 11, wherein, responsive to the second voltage being greater than the first voltage by less than a voltage threshold, the second voltage is applied to the header circuitry in order to precharge the bit line of the memory cell and wherein, responsive to the second voltage being greater than the first voltage by less than the voltage threshold, the second voltage is passed through the fourth PFET to the header circuitry.

18. The memory of claim 11, wherein, responsive to an absolute difference of the first voltage and the second voltage being less than a voltage threshold, both the third PFET and the fourth PFET behave like a diode in analog mode thereby allowing a maximum of the first voltage or the second voltage to be driven down to Vmax minus the voltage threshold.

19. An apparatus, comprising:
a processor; and
a memory coupled to the processor, wherein the memory comprises:
a set of memory cells;
a voltage selection circuit coupled to the set of memory cells, wherein the voltage selection circuit comprises:
cross-coupled circuitry, wherein the cross-coupled circuitry comprises a first positive-channel field effect transistor (PFET) and a second PFET, wherein:
a source of the first PFET is coupled to a first voltage,
a gate of the first PFET is coupled to a second voltage,
a drain of the first PFET is coupled to an input of a header circuitry, wherein the header device precharges a bit line of a memory cell,
a source of the second PFET is coupled to the second voltage,
a gate of the second PFET is coupled to the first voltage, and
a drain of the second PFET is coupled to the input to the header circuitry; and
diode circuitry, wherein the diode circuitry comprises a third PFET and a fourth PFET, wherein:
a source of the third PFET is coupled to the first voltage,
a gate of the third PFET is coupled to the input to the header circuitry,
a drain of the third PFET is coupled to the input to the header circuitry,
a source of the fourth PFET is coupled to the second voltage,
a gate of the fourth PFET is coupled to the input to the header circuitry, and
a drain of the fourth PFET is coupled to the input to the header circuitry.

20. The apparatus of claim 19, wherein, responsive to the first voltage being greater than the second voltage by a voltage threshold, the first voltage is applied to the header circuitry in order to precharge the bit line of the memory cell and wherein, responsive to the first voltage being greater than the second voltage by the voltage threshold, the first voltage deactivates the second PFET thereby preventing the second voltage from passing to the header circuitry.

21. The apparatus of claim 19, wherein, responsive to the second voltage being greater than the first voltage by a voltage threshold, the second voltage is applied to the header circuitry in order to precharge the bit line of the memory cell and wherein, responsive to the second voltage being greater than the first voltage by the voltage threshold, the second voltage deactivates the first PFET thereby preventing the first voltage from passing to the header circuitry.

22. The apparatus of claim 19, wherein, responsive to the first voltage being greater than the second voltage by less than a voltage threshold, the first voltage is applied to the header circuitry in order to precharge the bit line of the memory cell and wherein, responsive to the first voltage being greater than the second voltage by less than the voltage threshold, the first voltage is passed through the third PFET to the header circuitry.

23. The apparatus of claim 19, wherein, responsive to the second voltage being greater than the first voltage by less than a voltage threshold, the second voltage is applied to the header circuitry in order to precharge the bit line of the memory cell and wherein, responsive to the second voltage being greater than the first voltage by less than the voltage threshold, the second voltage is passed through the fourth PFET to the header circuitry.

24. The apparatus of claim 19, wherein, responsive to an absolute difference of the first voltage and the second voltage being less than a voltage threshold, both the third PFET and the fourth PFET behave like a diode in analog mode thereby allowing a maximum of the first voltage or the second voltage to be driven down to Vmax minus the voltage threshold.

* * * * *